(12) United States Patent
Gritti et al.

(10) Patent No.: US 11,945,714 B2
(45) Date of Patent: Apr. 2, 2024

(54) ELECTRONIC DEVICE AND CORRESPONDING METHOD

(71) Applicant: STMICROELECTRONICS S.r.l., Agrate Brianza (IT)

(72) Inventors: Alex Gritti, Vimercate (IT); Marco Del Sarto, Monza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 69 days.

(21) Appl. No.: 17/390,634

(22) Filed: Jul. 30, 2021

(65) Prior Publication Data
US 2022/0033251 A1 Feb. 3, 2022

(30) Foreign Application Priority Data

Jul. 30, 2020 (IT) .......................... 102020000018613

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01); *B81B 2207/015* (2013.01); *B81C 2203/0109* (2013.01)

(58) Field of Classification Search
CPC ... B81B 7/0038; B81B 7/0058; B81B 7/0077; B81B 7/0061; B81B 7/02; B81B 2207/015; B81B 2201/0264; B81B 2201/0257; B81B 2207/098; H01L 24/82; H01L 23/564; H01L 24/24; H01L 25/18; H01L 23/04; H01L 24/73; H01L 24/92; H01L 23/053; H01L 24/48; H01L 25/0655; H01L 23/10; H01L 2224/24011; H01L 2924/181; H01L 2224/92247; H01L 2225/06506; H01L 2224/24051; H01L 2224/48227; H01L 2224/82102; H01L 2225/0651; H01L 2224/48145; H01L 2224/83192; H01L 2224/27312; H01L 2924/16251; H01L 2224/48095; H01L 2224/73227; H01L 2224/8592; H01L 2225/06568;
(Continued)

(56) References Cited

U.S. PATENT DOCUMENTS 5,959,353 A 9/1999 Tomita
6,048,754 A 4/2000 Katayama et al.
(Continued)

FOREIGN PATENT DOCUMENTS

CN 101278181 A 10/2008
CN 103097872 A 5/2013
(Continued)

OTHER PUBLICATIONS

International Standard ISO 22810, First Edition Aug. 1, 2010, Horology—Water-resistant watches, 14 pages.

*Primary Examiner* — Mouloucoulaye Inoussa
(74) *Attorney, Agent, or Firm* — Seed IP Law Group LLP (57) ABSTRACT

An electronic device comprises a "waterproof" package including a substrate of an organic material permeable to humidity and/or moisture as well as one or more electronic components arranged on the substrate. The substrate comprises a barrier layer capable of countering penetration of humidity and/or moisture into the package through the organic material substrate.

26 Claims, 3 Drawing Sheets

(58) Field of Classification Search
CPC . H01L 2224/48091; H01L 2924/00014; H01L 2924/00012; H01L 2924/1461; H01L 2924/19106; H01L 2224/95; H01L 2924/15; H01L 2224/48137; H01L 2224/73265; H01L 2924/16152; H01L 2924/15174; H01L 2224/16225; H01L 2924/16151; H01L 2224/32145; H01L 2224/05014; B81C 1/00285; B81C 1/00333; B81C 1/0023; B81C 1/00277; B81C 2203/0109; B81C 2203/0118; H04R 1/086; H04R 19/04; H04R 19/005; H04R 1/406; H04R 1/083; H04R 1/04; H04R 1/028; H04R 2201/003; H04R 2410/05; G01L 19/0092; G01L 9/0045; G01L 19/147; G01L 9/0054; G01L 9/08; G01L 11/06; G01L 2019/0053
USPC .......... 257/704, 680, 723, 416, 415, E23.18, 257/E21.002; 438/126, 51; 427/569, 427/497; 313/506; 428/411.1, 412, 413, 428/423.1, 457, 474.4, 521, 522, 523, 428/698, 473.5; 381/355, 175, 361
See application file for complete search history.

(56) References Cited

U.S. PATENT DOCUMENTS

| | | | |
|---|---|---|---|
| 9,548,273 B2* | 1/2017 | Gao | H01L 21/6835 |
| 9,593,995 B2 | 3/2017 | Wagner et al. | |
| 10,549,982 B2 | 2/2020 | Duqi et al. | |
| 10,587,942 B1* | 3/2020 | Minervini | B81B 7/0038 |
| 2002/0172384 A1* | 11/2002 | Takeuchi | H04R 19/005 381/175 |
| 2003/0047002 A1 | 3/2003 | Arms et al. | |
| 2004/0046497 A1* | 3/2004 | Schaepkens | H10K 50/844 313/506 |
| 2005/0124167 A1 | 6/2005 | Nevin et al. | |
| 2005/0181212 A1* | 8/2005 | Schaepkens | H10K 50/8445 428/521 |
| 2005/0288392 A1 | 12/2005 | Okubora | |
| 2006/0208634 A1* | 9/2006 | Schaepkens | C23C 16/45523 313/506 |
| 2007/0013052 A1* | 1/2007 | Zhe | H01L 23/552 257/E23.114 |
| 2007/0084270 A1 | 4/2007 | Jarrett | |
| 2007/0158826 A1* | 7/2007 | Sakakibara | B81B 7/0064 257/723 |
| 2008/0175425 A1* | 7/2008 | Roberts | H04R 19/005 381/361 |
| 2008/0197485 A1* | 8/2008 | Theuss | H01L 23/055 257/723 |
| 2008/0283988 A1* | 11/2008 | Huang | B81B 7/0061 257/E23.18 |
| 2008/0315333 A1* | 12/2008 | Combi | B81B 7/02 257/E23.193 |
| 2009/0026560 A1 | 1/2009 | Wombacher et al. | |
| 2009/0286010 A1* | 11/2009 | Erlat | H01J 37/32 118/723 MP |
| 2010/0284553 A1* | 11/2010 | Conti | B81C 1/00158 381/174 |
| 2011/0075875 A1* | 3/2011 | Wu | B81C 1/0023 381/361 |
| 2011/0293126 A1* | 12/2011 | Maekawa | H04R 19/005 381/355 |
| 2011/0293128 A1* | 12/2011 | Kuratani | B81C 1/0023 381/361 |
| 2012/0126347 A1* | 5/2012 | Yang | H01L 23/04 438/118 |
| 2012/0212925 A1* | 8/2012 | Zoellin | G01L 19/141 361/807 |
| 2012/0237073 A1* | 9/2012 | Goida | H04R 1/02 381/361 |
| 2012/0270354 A1 | 10/2012 | Hooper et al. | |
| 2013/0313698 A1* | 11/2013 | Chen | H01L 23/4334 257/690 |
| 2013/0322675 A1* | 12/2013 | Zoellin | H04R 1/04 381/355 |
| 2014/0034373 A1 | 2/2014 | Yoshikawa et al. | |
| 2014/0037120 A1* | 2/2014 | Lim | H04R 1/04 381/355 |
| 2014/0061892 A1* | 3/2014 | Ziglioli | B81B 7/0058 438/126 |
| 2014/0064546 A1* | 3/2014 | Szczech | H04R 19/04 381/361 |
| 2014/0116122 A1* | 5/2014 | Lammel | G01N 27/041 73/73 |
| 2014/0183671 A1* | 7/2014 | Kuratani | B81B 7/0064 257/416 |
| 2014/0361387 A1* | 12/2014 | Meyer | H03H 9/0547 438/51 |
| 2014/0374852 A1* | 12/2014 | Raleigh | B81B 7/0064 438/51 |
| 2015/0001645 A1* | 1/2015 | Faralli | B81C 1/00269 438/53 |
| 2015/0014798 A1* | 1/2015 | Faralli | B81B 7/0058 257/467 |
| 2015/0145113 A1* | 5/2015 | Chen | H01L 23/49816 257/690 |
| 2015/0189446 A1* | 7/2015 | Wang | H04R 19/005 381/174 |
| 2015/0264463 A1* | 9/2015 | Kuzuyama | B81C 1/0023 381/174 |
| 2015/0291415 A1 | 10/2015 | Haney et al. | |
| 2015/0325552 A1* | 11/2015 | Liu | H01L 24/82 438/109 |
| 2015/0325557 A1* | 11/2015 | Yiu | H01L 27/14634 438/48 |
| 2016/0044396 A1* | 2/2016 | Wang | H04R 1/04 257/416 |
| 2016/0049385 A1* | 2/2016 | Yu | H01L 23/481 257/774 |
| 2016/0241953 A1* | 8/2016 | Elian | H04R 1/406 |
| 2016/0254487 A1 | 9/2016 | Harikrishna Mohan et al. | |
| 2017/0013355 A1* | 1/2017 | Kim | H04R 19/005 |
| 2017/0089795 A1* | 3/2017 | Perkins | G01L 19/0672 |
| 2017/0117252 A1* | 4/2017 | Baik | H01L 23/3128 |
| 2017/0174511 A1 | 6/2017 | Ehmke | |
| 2017/0179017 A1* | 6/2017 | Tsai | H01L 23/13 |
| 2017/0233245 A1 | 8/2017 | Duqi et al. | |
| 2017/0334714 A1* | 11/2017 | Gao | B81C 1/00277 |
| 2018/0148316 A1* | 5/2018 | Duqi | G01L 19/147 |
| 2018/0149538 A1* | 5/2018 | Gritti | G01L 19/0092 |
| 2018/0151796 A1* | 5/2018 | Akahane | H01L 25/04 |
| 2018/0190617 A1* | 7/2018 | Chew | H01L 25/50 |
| 2019/0287868 A1* | 9/2019 | Zelikson | H01L 24/17 |
| 2019/0295917 A1* | 9/2019 | Kim | H01L 24/73 |
| 2020/0003831 A1* | 1/2020 | Aranzulla | G01R 31/2896 |
| 2020/0015027 A1* | 1/2020 | Niederberger | H04R 1/42 |
| 2020/0092506 A1* | 3/2020 | Park | G11C 7/16 |
| 2020/0219790 A1* | 7/2020 | Uppal | H01L 23/3135 |
| 2020/0365559 A1* | 11/2020 | Hwang | H01L 23/3121 |
| 2021/0336585 A1* | 10/2021 | Mares | H01L 23/42 |

FOREIGN PATENT DOCUMENTS

| | | |
|---|---|---|
| CN | 106461482 A | 2/2017 |
| CN | 107084806 A | 8/2017 |
| CN | 107976287 A | 5/2018 |
| EP | 3205997 A1 | 8/2017 |
| JP | 2012042489 A | 3/2012 |
| WO | 2008038383 A1 | 4/2008 |

* cited by examiner

ELECTRONIC DEVICE AND CORRESPONDING METHOD

BACKGROUND

Technical Field

The description relates to electronic devices. One or more embodiments may be applied to electronic sensors such as ASIC/MEMS sensors.

Description of the Related Art

ASIC and MEMS are well-known acronyms for Application Specific Integrated Circuit and Micro Electro-Mechanical Systems, respectively.

Manufacturing electronic devices such as, e.g., ASIC/MEMS sensors, is an area of technology which has attracted extensive research activity, as witnessed in technical and patent literature.

Despite the extensive research in this area, researchers continue to carry out research to determine improved solutions for features in packages of electronic devices.

For instance, contamination by contaminants coming from outside environments is a point attracting consideration and the ability of effectively countering penetration of humidity and/or moisture and subsequent contamination of the electronic component(s) therein represents features of improvement in packages of electronic devices.

BRIEF SUMMARY

One or more embodiments of the present disclosure are directed to contribute in providing improved solutions along the lines discussed in the foregoing.

According to one or more embodiments of the present disclosure or within the scope of the present disclosure, the improved solution can be achieved by means of a device having the features set forth in the claims that follow.

One or more embodiments may relate to a corresponding method.

The claims are an integral part of the technical disclosure of embodiments as provided herein.

One or more embodiments may provide various improvements in the manufacturing of electronic device packages.

For instance, one or more embodiments may:
 reduce costs in comparison with packages wherein one or more electronic components are arranged on substrates of ceramic material;
 lead to easier assembly processes in comparison with packages comprising substrates of ceramic material.

BRIEF DESCRIPTION OF THE SEVERAL VIEWS OF THE DRAWINGS

One or more embodiments will now be described, by way of example only, with reference to the figures of the present disclosure.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments.

The headings/references used herein are provided merely for convenience and hence do not define the extent of protection or the scope of the embodiments.

Electronic devices may comprise one or more electronic components arranged on a substrate.

A wide range of applications may take advantage from packages that can effectively counter contamination of electronic components by contaminants coming from an outside environment.

For instance, effectively countering penetration of moisture and/or humidity into electronic devices reduces the risk of moistening the electronic component(s) arranged on a substrate.

To that effect, various types of packages having waterproofing activity, currently referred to as "waterproof packages," have been set forth within the present disclosure.

At least so far, the manufacture of such waterproof packages generally involves resorting to substrates of ceramic material, hereinafter referred to as "ceramic substrates."

In fact, ceramic may act as a barrier able to counter penetration through the substrate of humidity and/or moisture coming from the outside environment, which may result in reducing contamination of the electronic component(s) arranged thereon.

It is noted that the use of ceramic substrates for this purpose has certain drawbacks.

In fact, ceramic materials may be expensive.

Moreover, ceramics are commonly supplied by suppliers as a single-unit format. This may result in a requirement for a specific assembly process on a reconstruction strip, which may result in undesirably long and complex package manufacturing methods.

The issues discussed in the foregoing have been addressed resorting to substrates of alternative materials exhibiting waterproofing activity, such as fluorinated or non-fluorinated poly(p-xylylene), also known under the trade designation of Parylene, acrylic resin, epoxy resin, polyurethane, silicones, amorphous fluoropolymer and silicon dioxide, possibly in mix with the above, such as in the material available under the trade designation of Coat-X.

However, these materials may still be expensive.

A cheaper alternative to the use of ceramic substrates may be represented by the use of substrates of organic material, hereinafter referred to as "organic" substrates.

Organic substrates may be known as CCL (Copper Clad Laminate). CCL may comprise flame-retardant fiberglass reinforced with epoxy dielectric material. Such organic substrates may comprise one or more of the following materials: the material available under the trade designation of FR4, Bismaleimide-Triazine (BT), the material available under the trade designation of ABF—which is a three-layered polymer system, commonly having a support layer of polyethylene terephthalate, a resin layer, and a cover layer—the material available under the trade designation of Roger and molding resin types. Rigid-Flex substrates, which may include polyamide material coated by copper foils, may be suitable organic substrates as well.

Such organic substrates may have a cost which is ten times lower than the cost of ceramic substrates. Moreover, the use of organic substrates may result in simplified package manufacturing methods.

It is noted that organic substrates may not be suited for manufacturing electronic devices intended to be exposed to severe environmental conditions, e.g., applications involving possible contact with liquids such as oil and water. This may be due to a possible tendency of organic substrates to absorb humidity and/or moisture from the outside environment. Absorption of humidity and/or moisture by organic substrates may militate against preventing contamination of the electronic component(s) arranged thereon.

For that reason, ceramic substrates are commonly preferred over organic substrates for manufacturing waterproof packages, in spite of the drawbacks discussed in the foregoing.

One or more embodiments may facilitate resorting to organic substrates in "waterproof" electronic device packages, capable of countering contamination of the component(s) therein by humidity and/or moisture coming from the outside environment.

In one or more embodiments, waterproof packages can be manufactured resorting to organic substrates and forming a barrier layer covering, at least partially, a front (upper) surface of the organic substrates.

Figure 1:
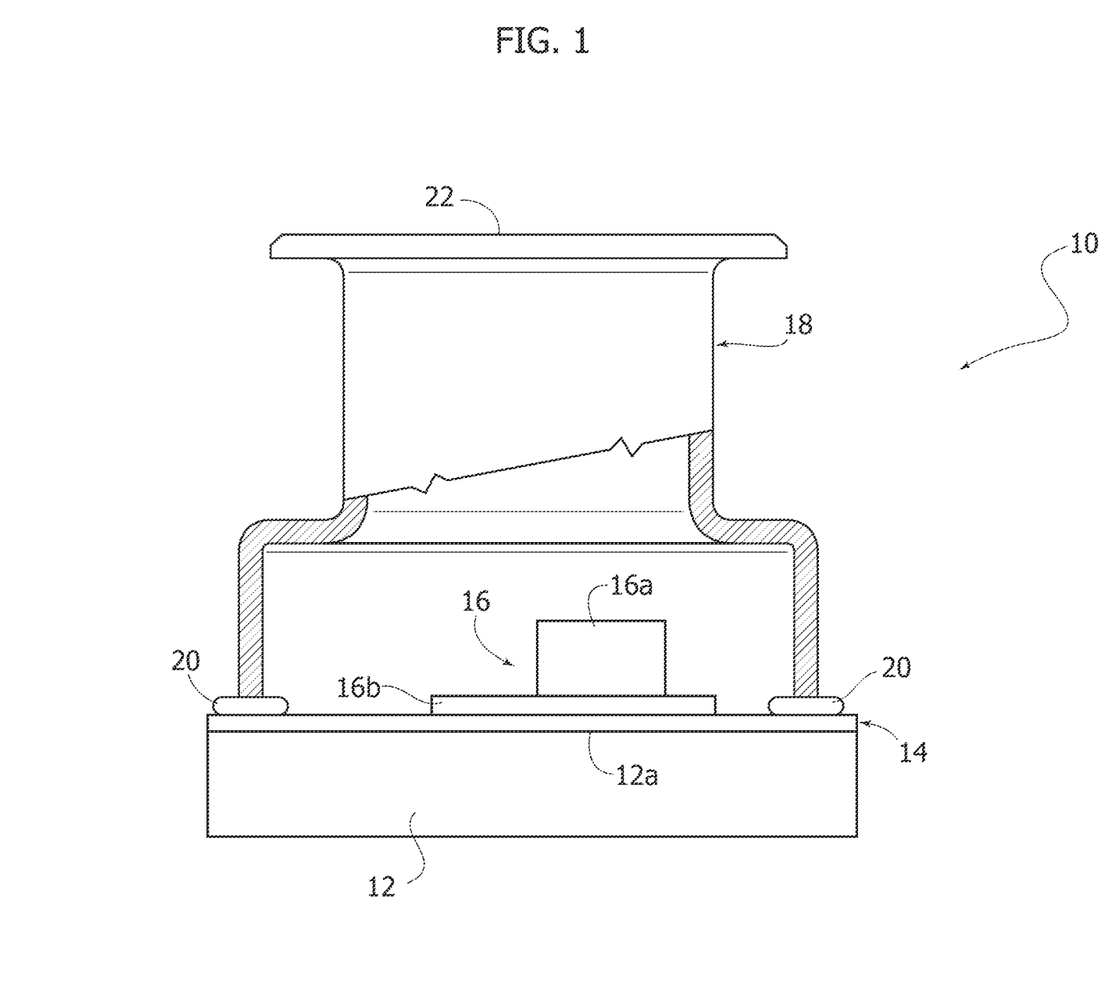
FIG. 1 is a partially broken side elevational view of a device according to embodiments.

FIG. 1 is a cross-sectional view of an electronic device 10 to which embodiments may apply.

The electronic device 10 may include a substrate 12.

In one or more embodiments, the substrate 12 may include organic material. In some embodiments, the substrate 12 may comprise (and possibly essentially consist) of organic material.

In one or more embodiments, the organic material may include, for instance, one or more of the following materials: the material available under the trade designation of FR4, Bismaleimide-Triazine (BT), the material available under the trade designation of ABF, polyamide, the material available under the trade designation of Roger, polytetrafluoroethylene (PTFE) and molding resin.

It is noted that such materials are per se unable to counter to a desired extent contamination of the component(s) therein by humidity and/or moisture coming from the outside environment.

In one or more embodiments, such a desired effect can be achieved by including in the substrate 12 a barrier layer 14 capable of countering passage (propagation, diffusion) humidity and/or moisture through the substrate 12. For example, the barrier layer 14 may be an impermeable material, a watertight material, or some other suitable type of material through which humidity and/or moisture may not readily or substantially penetrate or pass through.

For instance, (and as illustrated in FIG. 1) the layer 14 may be formed on the front (here upper) surface 12a of the substrate 12.

For instance, the layer 14 may be formed recessed within or in the front (here upper) surface 12a of the substrate 12.

While non-mandatory per se (as a possible alternative, the layer 14 can be embedded within the substrate 12, for instance) such an option was found to be advantageous over alternative options and will be discussed throughout this description as exemplary of the embodiments. For example, the layer 14 may extend into the surface 12a of the substrate 12.

In one or more embodiments, the layer 14 may include material exhibiting very low water absorption, near or notionally equal to zero, or may be equal to zero or notionally equal to zero or substantially equal to zero. For example, the layer 14 may be a solder resist material. The material may be a water resistant material, such as an organic polymeric material.

The solder resist material may be a solder resist ink that is inkjet printed onto the substrate 12 forming the layer 14. The layer 14 may be an organic polymeric material, which is printable utilizing an ink jet printer.

In one or more embodiments as exemplified in view of FIG. 1, the layer 14 may entirely cover the front surface 12a of the substrate 12, which is shown in FIG. 1. However, as discussed in the following, this is not mandatory, and in one or more further alternative embodiments, the layer 14 may partially cover the front surface 12a of the substrate 12, leaving one or more areas of the upper surface 12a of the substrate 12 uncovered.

As exemplified herein, the electronic device 10 may include at least one electronic component 16. For instance, the component(s) 16 may include a combination of electronic components such as, for instance, a sensor 16a (a MEMS sensor may be exemplary of such a sensor) and a companion electronic circuit such as an integrated circuit 16b (an ASIC may be exemplary of such an integrated circuit).

As exemplified in FIG. 1, the "first" component 16a may be mounted on the "second" component 16b in a stacked arrangement. However, the first component 16a and the second component 16b may also be arranged side by side. For example, the first component 16a may not be on the second component 16b, and, instead, the first and second components 16a, 16b are on the surface 12a and may be adjacent to each other.

In one or more embodiments, electrically-conductive formations (for instance a wire bonding pattern, which are well known) are not visible in FIG. 1 for the sake of simplicity. However, it will be readily appreciated that electrically conductive formations such as a wire bonding pattern may be provided to electrically couple the first and second components 16a, 16b to each other or to the substrate 12.

In one or more embodiments, the electronic component(s) 16 may be arranged on the substrate 12.

In one or more embodiments as exemplified in FIG. 1, the electronic components(s) 16 may be arranged on the layer 14 formed on the front surface 12a of the substrate 12.

In one or more embodiments the electronic component(s) 16 can be attached onto the layer 14 resorting to conventional methods known in the art for this purpose, e.g., via an attach adhesive, which is not visible in FIG. 1 for simplicity.

In one or more embodiments, as exemplified in FIG. 1, the package of the electronic device 10 may be completed by a cap member 18 applied onto the substrate 12 and covering the electronic component(s) 16 arranged thereon.

In one or more embodiments, the cap member 18 may be a metal lid (including stainless-steel, for instance).

The cap member 18 may facilitate protecting the electronic component(s) 16 from the outside environment.

In one or more embodiments, the cap member 18 may exhibit a tubular shape overall and include:

a "proximal" enlarged portion sealingly coupled (by an attach solder or glue forming a seal 20) to the substrate 12 and covering the electronic component(s) 16 arranged on the substrate 12, and a "distal" portion extending away from the substrate 12 having a terminal opening 22 arranged at (above, for instance) the electronic component(s) 16 arranged on the substrate 12.

An encapsulating ("potting") gel may encapsulate the electronic component(s) 16 and possibly the seal 20.

A cap member 18 as exemplified herein may be manufactured utilizing to various technologies.

Additive manufacturing (3D printing), stamping or cold forming are exemplary of such possible technologies to form the cap member 18.

A feature of embodiments as illustrated herein or within the scope of the present disclosure lies in that penetration of humidity and/or moisture into the device package due to passage (propagation, diffusion) through the substrate 12 is countered by the layer 14 associated therewith.

For instance, this may result from the layer 14 being formed onto the front surface 12*a* of the substrate 12.

In that way, as illustrated in FIG. 1, the cap 18 can be sealingly coupled to the substrate 12 by being sealingly coupled (at the seal 20) to the layer 14 formed thereon.

FIGS. 2A to 2C and 3A, 3B are exemplary of various acts which may be implemented in fabricating an electronic device 10 as exemplified in FIG. 1.

Throughout FIGS. 2A to 2C and 3A, 3B parts or elements like parts or elements already discussed in connection with FIG. 1 are indicated with like reference symbols/numerals and a corresponding description will not be repeated for brevity and simplicity of the present disclosure.

Figure 2A:
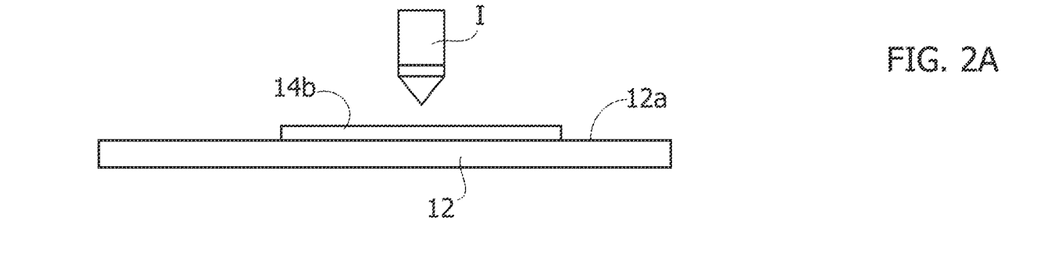
FIGS. 2A to 2C are exemplary of possible acts or steps which may be used in embodiments.

An act as exemplified in FIG. 2A may include forming a barrier layer 14 (14*a*, 14*b*) as discussed previously onto the front surface 12*a* of an organic substrate 12 expected to host an electronic component 16 (16*a*, 16*b*). In some embodiments, the barrier layer 14 may be formed to fully and entirely cover the front surface 12*a* of the substrate 12. In some other embodiments, the barrier layer 14 may be formed to partially cover the front surface 12*a* of the substrate 12.

Figure 2B:
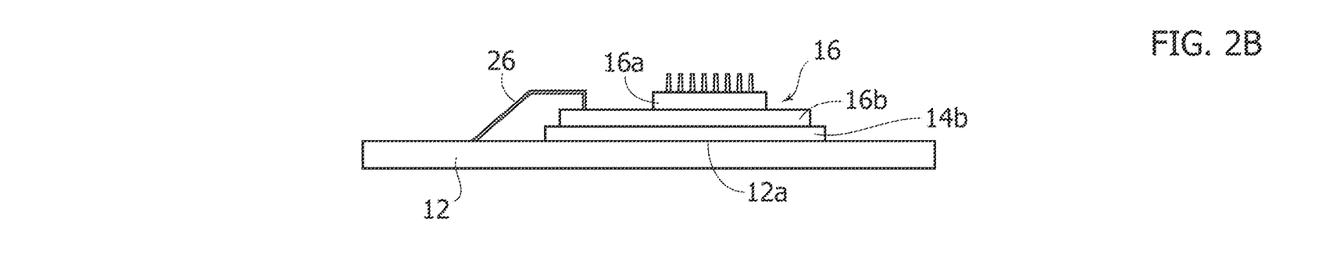
Figure 2C:
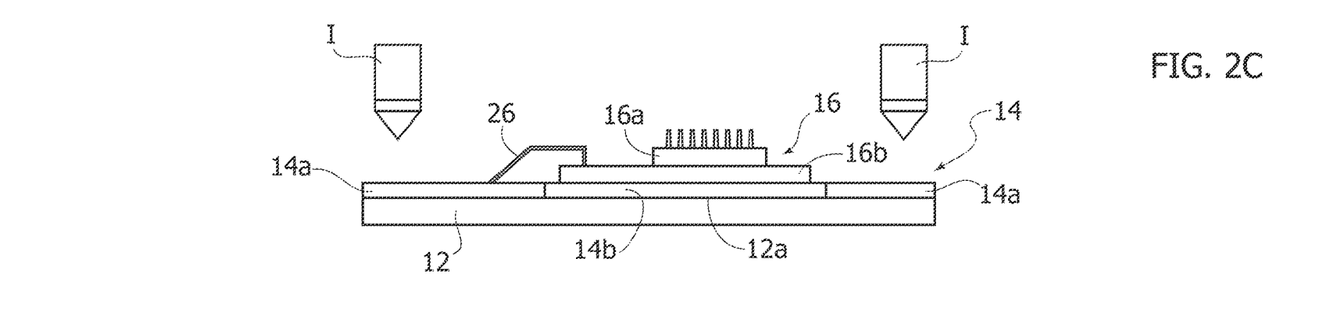

In one or more embodiments, the barrier layer 14 may be formed utilizing inkjet printing technology as exemplified at I in FIGS. 2A and 2C. For example, the inkjet printing technology may be an inkjet print head. The inkjet print head may deposit droplets of the material or spray the material onto the front surface 12*a* of the substrate 12.

Inkjet printing technology may be advantageous with respect to other technologies known in the art for carrying out the same or similar purpose. In fact, utilizing inkjet printing technology may result in a simplified patterning process involving direct pattern printing of the material.

Moreover, printing may be carried out without contacting the area to be printed, which may reduce the risk of malfunction, contamination, and/or defects. In addition, inkjet printing technology may facilitate avoiding the necessity of using photography tools and artwork.

In one or more embodiments as exemplified in FIGS. 2A to 2C, the barrier layer 14 may at first only partially cover the front surface 12*a* of the substrate 12 leaving one or more areas of the upper surface 12*a* uncovered. For example, a first area may be uncovered around a second area that is covered by the material at which an electronic component 16 (16*a*, 16*b*) will be present.

An act as exemplified in FIG. 2B may include arranging an electronic component 16 onto a central portion 14*b* of the barrier layer 14. The central portion 14*b* of the barrier layer 14 is formed by the inkjet printing technology I as shown in FIG. 2A.

In certain embodiments as discussed previously, the electronic component(s) 16 may include a combination of, for instance, a sensor 16*a* (a MEMS sensor may be exemplary of such a sensor) and a companion electronic circuit such as an integrated circuit 16*b* (an ASIC may be exemplary of such an integrated circuit). The first component 16*a* and the second component 16*b* may be in a stack arrangement as shown and/or arranged side by side.

An act as exemplified in FIG. 2B may further include electrically coupling electrically conductive pads of the electronic component(s) 16 to a second plurality of pads of the substrate 12 via electrically conductive formations, e.g., via an otherwise conventional wire bonding pattern referenced 26.

An act as exemplified in FIG. 2C may include expanding the layer 14 having the electronic component(s) 16 arranged thereon (as resulting from the act of FIG. 2A) so that the barrier layer 14 may cover the entire front surface 12*a* of the substrate 12 (by embedding the "distal" ends of the wires in the wire bonding pattern 26). The layer 14 may be expanded by forming a peripheral portion 14*a* adjacent to the central portion 14*a* as formed in FIG. 2A. The peripheral portion 14*b* may be formed in the same or similar manner as discussed earlier with respect to forming the central portion 14*a* as shown in FIG. 2A. However, the peripheral portion 14*b* may be formed by a different process than the central portion 14*a* as shown in FIG. 2A or vice versa. The peripheral portion 14*a* may be around or surround the central portion 14*b*. The central portion 14*b* may be a first portion and the peripheral portion 14*a* may be a second portion.

Such expansion of the layer 14 may again involve inkjet printing technology.

Figure 3A:
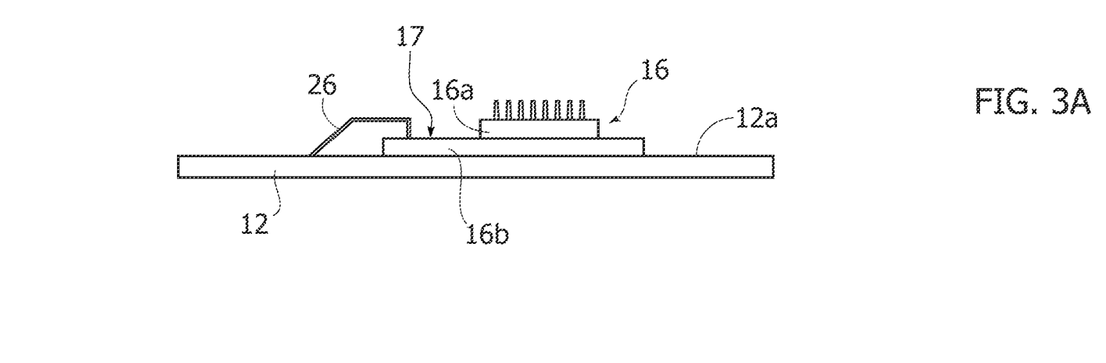
FIGS. 3A and 3B are exemplary of possible acts or steps which may be used in further embodiments.
Figure 3B:
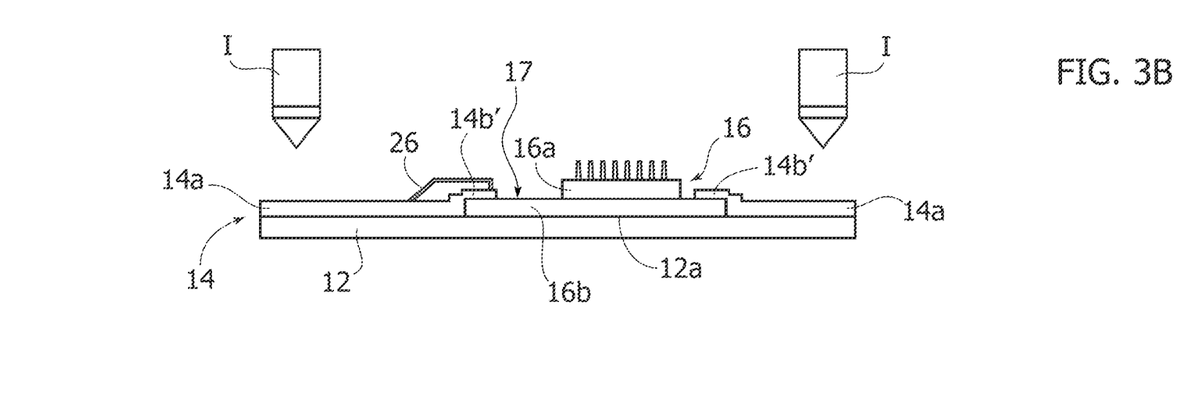

One or more embodiments as exemplified in FIGS. 3A-3B may differ from embodiments as exemplified in FIGS. 2A-2C, in that as shown in FIGS. 3A-3B, the electronic component(s) 16 may be arranged onto the—substrate 12 before forming the layer 14.

This is in contrast with respect to FIGS. 2A-2C in which the electronic component(s) 16 may be arranged onto the substrate 12 after forming at least the portion 14*b* of the layer 14.

An act as exemplified in FIG. 3A may include arranging the electronic component(s) 16 onto the substrate 12—with no layer 14 therebetween—and providing the wire bonding pattern 26.

An act as exemplified in FIG. 3B may include forming the layer 14 onto the front surface 12*a* of the substrate 12 having the electronic component(s) 16 already arranged thereon. Again, the layer 14 may be formed resorting to inkjet printing technology as discussed previously.

In one or more embodiments as exemplified in FIGS. 3A and 3B, the layer 14 may be formed around the electronic component(s) 16, by embedding the "distal" ends—and possibly also the "proximal" ends—of the wires in the wire bonding pattern 26. The "distal" ends may be ends of the wires at the surface of the substrate 12*a,* and the "proximal" ends may be ends of the wires at the electronic component(s) 16. The layer 14 (14*a*, 14*b*') may partially cover a surface 17 of the second component 16*b*. The first component 16*a* may be on the surface 17 and spaced apart from the layer 14.

Covering both the "distal" and the "proximal" ends of the wires in the wire bonding pattern 26 was found to be advantageous insofar as this may result in an increase in robustness of electric couplings between the electronic component(s) 16 and the substrate 12.

Acts as exemplified in FIGS. 2A-2C where found to be advantageous in embodiments where the electronic component(s) 16 might be affected by stresses induced by the printing process of the material forming the layer 14.

For instance, in embodiments wherein the electronic component 16 includes a sensor 16a and an electronic circuit 16b, the sensor 16a may be affected by stresses induced by the printing process of the material forming the layer 14.

Acts as exemplified in FIGS. 2A-2C may thus be advantageous in embodiments wherein a gap between pads in the electronic circuit 16b and lateral walls and/or pads in the sensor 16a may not be large enough for facilitating avoiding contact of the material forming the layer 14 with the sensor 16a.

Conversely, acts as exemplified in FIGS. 3A-3B may be advantageous in embodiments wherein the gap between pads in the electronic circuit 16b and lateral walls and/or pads in the sensor 16a may be considered large enough for facilitating avoiding contact of the material forming the layer 14 with the sensor 16a.

Consequently, in one or more embodiments, the electronic component(s) 16 may be arranged on an area of the front surface 12a of the substrate 12 which is not covered by the layer 14, with the layer 14 surrounding the electronic component(s) 16.

One or more embodiments may rely on the recognition that humidity and/or moisture possibly coming from the outside environment might penetrate in a package as illustrated herein through a substrate 12 of organic material. In one or more embodiments, such moisture penetration is effectively countered by providing in or on the substrate 12 (for instance at a front or upper surface 12a thereof) a barrier layer such as 14, which facilitates preventing penetration of humidity and/or moisture therethrough. As a consequence, the barrier layer 14 facilitates preventing contamination of the electronic component(s) 16 by humidity and/or moisture.

An electronic device (for instance, 10) as exemplified herein may include:
  a ("waterproof") package (for instance, 12, 18) including
    a substrate (for instance, 12) wherein the substrate includes organic material permeable to humidity and/or moisture,
    at least one electronic component (for instance, 16, 16a, 16b) in said package, the at least one electronic component arranged on said substrate,
    wherein said substrate includes a barrier layer (for instance, 14) countering penetration of humidity and/or moisture into the package through said substrate.

A device as exemplified herein may include organic material including at least one of the material available under the trade designation of FR4, Bismaleimide-Triazine (BT), the material available under the trade designation of ABF, polyamide, the material available under the trade designation of Roger, polytetrafluoroethylene (PTFE) and molding resin.

A device as exemplified herein may include organic material selected out of the group consisting of the material available under the trade designation of FR4, Bismaleimide-Triazine (BT), the material available under the trade designation of ABF, polyamide, the material available under the trade designation of Roger, polytetrafluoroethylene (PTFE) and molding resin.

In a device as exemplified herein, said package may include a cap portion (for instance, 18) covering the at least one electronic component, the cap portion sealingly coupled (for instance, the seal 20, possibly via the barrier layer) to said substrate.

In a device as exemplified herein, said barrier layer may be formed onto a surface (for instance, 12a) of said substrate. This may be the inner surface facing towards the interior of the package, having the electronic component(s) arranged thereon.

In a device as exemplified herein, said barrier layer may include a first portion (for instance, 14a) extending around the at least one electronic component, and a second portion (for instance, 14b or 14b') extending:
  between the at least one electronic component and said substrate (see, for instance, 14b in FIGS. 2B-2C), or (alternatively)
  over the periphery of the at least one electronic component (see, for instance, 14b' in FIGS. 3A-3B).

A device as exemplified herein may include electrically-conductive wire bonding formations (for instance, 26) between the at least one electronic component and said substrate, the electrically-conductive wire bonding formations having end bonds embedded in said barrier layer (at the distal ends—see for instance FIG. 2C—or at both ends—see for instance FIG. 3B).

A method as exemplified herein may include:
  arranging at least one electronic component (for instance 16, 16a, 16b) on a substrate (for instance, 12) in a package, wherein the substrate includes organic material permeable to humidity and/or moisture,
  providing in said substrate a barrier layer countering penetration of humidity and/or moisture into the package through said substrate.

With said package including a cap portion (for instance, 18) covering the at least one electronic component arranged on said substrate, a method as exemplified herein may include sealingly coupling (for instance, forming the seal 20) the cap portion to said substrate.

A method as exemplified herein may include forming said barrier layer onto a surface of said substrate. As noted, this may be the inner surface facing towards the interior of the package, having the electronic component(s) arranged thereon.

A method as exemplified herein may include:
  forming a first portion of said barrier layer extending around the at least one electronic component,
  forming a second portion of said barrier layer:
  between the at least one electronic component and said substrate, or (alternatively)
  over the periphery of the at least one electronic component.

Without prejudice to the underlying principles, the details and embodiments may vary, even significantly, with respect to what has been described by way of example only, without departing from the scope of protection.

An electronic device (10) may be summarized as including: a package (12, 18) including a substrate (12) wherein the substrate (12) comprises organic material permeable to humidity and/or moisture, at least one electronic component (16, 16a, 16b) in said package (12, 18), the at least one electronic component (16, 16a, 16b) arranged on said substrate (12), wherein said substrate (12) comprises a barrier layer (14) countering penetration of humidity and/or moisture into the package (12, 18) through said substrate (12).

Said organic material may be selected out of the group consisting of the material available under the trade designation of FR4, Bismaleimide-Triazine (BT), the material available under the trade designation of ABF, polyamide, the material available under the trade designation of Roger, polytetrafluoroethylene (PTFE) and molding resin. Said package (12, 18) may include a cap portion (18) covering the at least one electronic component (16, 16a, 16b), the cap portion (18) sealingly coupled (20) to said substrate (12). Said barrier layer (14) may be formed onto a surface (12a) of said substrate (12). Said barrier layer (14) may include a first portion (14a) extending around the at least one electronic component (16, 16a, 16b), and a second portion (14b; 14b') extending: between the at least one electronic component (16, 16a, 16b) and said substrate (12), or over the periphery of the at least one electronic component (16, 16a, 16b).

The electronic device (10) may include electrically-conductive wire bonding formations (26) between the at least one electronic component (16, 16a, 16b) and said substrate (12), the electrically-conductive wire bonding formations (26) having end bonds embedded in said barrier layer (14).

A method may be summarized as including: arranging at least one electronic component (16, 16a, 16b) on a substrate (12) in a package (12, 18), wherein the substrate (12) comprises organic material permeable to humidity and/or moisture, providing in said substrate (12) a barrier layer (14) countering penetration of humidity and/or moisture into the package through said substrate (12).

Said package (12, 18) may include a cap portion (18) covering the at least one electronic component (16, 16a, 16b) arranged on said substrate (12), the method including sealingly coupling (20) the cap portion (18) to said substrate (12).

The method may include forming said barrier layer (14) onto a surface (12a) of said substrate (12).

The method may include: forming a first portion (14a) of said barrier layer (14) extending around the at least one electronic component (16, 16a, 16b), forming a second portion (14b; 14b') of said barrier layer (14): between the at least one electronic component (16, 16a, 16b) and said substrate (12), or over the periphery of the at least one electronic component (16, 16a, 16b).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate including a surface and the substrate being an organic material configured to allow humidity or moisture into the substrate;
   at least one electronic component on the substrate;
   a cap member on the at least one electronic component, the cap member having a tubular shape with a proximal enlarged portion on the substrate and a distal portion extending from the substrate, the proximal enlarged portion of the cap covering an area of the surface of the substrate; and
   a barrier layer on the surface of the substrate, the barrier layer fully covering the area of the substrate that is covered by the proximal enlarged portion of the cap, the barrier layer configured to prevent humidity or moisture from the substrate.

2. The device of claim 1, wherein the organic material includes at least one of Bismaleimide-Triazine, polyamide, polytetrafluoroethylene, or molding resin.

3. The device of claim 1, wherein the barrier layer is an organic polymeric material.

4. The device of claim 1, wherein the distal portion of the cap member includes a terminal opening above the at least one electronic component.

5. The device of claim 1, wherein the cap member is coupled to the barrier layer on the substrate by an adhesive.

6. The device of claim 1, wherein the barrier layer includes a first portion extending around the at least one electronic component and a second portion extending between the at least one electronic component and the substrate.

7. The device of claim 1, wherein the barrier layer includes a first portion extending around the at least one electronic component and a second portion extending over a periphery of the at least one electronic component.

8. The device of claim 1, comprising electrically-conductive wire bonding formations between the at least one electronic component and the substrate, the electrically-conductive wire bonding formations having end bonds embedded in the barrier layer.

9. The device of claim 1, wherein the barrier layer is recessed within the substrate.

10. The device of claim 1, wherein the at least one electronic component is within the barrier layer.

11. The device of claim 1, wherein the barrier layer is between the at least one electronic component and the surface of the substrate.

12. A method, comprising:
    forming at a surface of a substrate a barrier layer—configured to prevent humidity or moisture, the substrate being an organic material configured to allow humidity or moisture;
    attaching at least one electronic component on the substrate; and
    covering the at least one electronic component with a cap member configured in a tubular shape having a proximal enlarged portion and a distal portion extending from the substrate, the proximal enlarged portion of the cap covering a first area of the surface of the substrate, the barrier layer completely covering at least the first area.

13. The method of claim 12, wherein covering the at least one electronic component on the substrate with the distal portion of the cap member includes a terminal opening.

14. The method of claim 12, further comprising forming the barrier layer onto the surface of the substrate and coupling the cap member to the barrier layer on the substrate.

15. The method of claim 14, further comprising:
    forming a first portion of the barrier layer extending around the at least one electronic component; and
    forming a second portion of the barrier layer between the at least one electronic component and the substrate.

16. The method of claim 14, further comprising:
    forming a first portion of the barrier layer extending around the at least one electronic component; and
    forming a second portion of the barrier layer over a periphery of the at least one electronic component.

17. A device, comprising:
a package including:
- a substrate including a first surface, the substrate being a molding resin;
- at least one electronic component on the substrate;
- a barrier layer on the first surface of the substrate, the barrier layer being a solder resist material; and
- a cap member coupled to the barrier layer, wherein the cap member is a tubular shape having a wider end at the at least one electronic component and a narrower end spaced from the at least one electronic component, the wider end completely covering an area of the surface of the substrate, the barrier layer completely covering the area.

18. The device of claim 17, wherein the barrier layer is positioned between the at least one electronic component and the surface of the substrate.

19. The device of claim 17, wherein the barrier layer is on sidewalls of the at least one electronic component.

20. The device of claim 17, wherein the package further including a wire extending from the at least one electrical component to the substrate, the wire including a first end on the at least one electrical component and a second end opposite to the first end on the substrate, the first end through the barrier layer.

21. A system, comprising:
- a substrate configured to allow humidity into the substrate;
- a barrier layer on a first surface of the substrate, wherein the barrier layer is configured to prevent humidity from the substrate;
- an integrated circuit die on the barrier layer;
- a sensor die on the integrated circuit die; and
- a cap coupled to the barrier layer and positioned over the integrated circuit die and the sensor die, wherein the cap is a tubular shape, and the substrate being spaced from the cap by the barrier layer, and the cap covers an area of the substrate, the barrier layer extending across the entire area covered by the cap.

22. The system of claim 21 further comprising a seal directly coupled between the cap and the barrier layer.

23. The system of claim 21 wherein the integrated circuit die is coupled to the substrate and the barrier layer is on the substrate around the integrated circuit die.

24. The system of claim 23 further comprising a cavity between the cap and the barrier layer, the barrier completely separating the substrate from the cavity.

25. The system of claim 24 wherein the sensor die is on the integrated circuit die and is separated from the substrate by the integrated circuit die.

26. The system of claim 25 wherein the barrier layer is on sidewalls and a first surface of the integrated circuit, a second surface of the integrated circuit facing the substrate.

\* \* \* \* \*

UNITED STATES PATENT AND TRADEMARK OFFICE
CERTIFICATE OF CORRECTION

PATENT NO. : 11,945,714 B2
APPLICATION NO. : 17/390634
DATED : April 2, 2024
INVENTOR(S) : Alex Gritti et al.

It is certified that error appears in the above-identified patent and that said Letters Patent is hereby corrected as shown below:

In the Claims

Column 10, Line 38, Claim 12:
"layer---------"
Should be:
-- layer --.

Signed and Sealed this
Fourth Day of June, 2024

Katherine Kelly Vidal
*Director of the United States Patent and Trademark Office*